(12) United States Patent
Balakrishnan

(10) Patent No.: US 8,271,067 B1
(45) Date of Patent: Sep. 18, 2012

(54) METHOD AND APPARATUS TO GRAPHICALLY DISPLAY A PRE-SCAN VOLUME ON A LOCALIZER IMAGE

(75) Inventor: Sathish Kumar Balakrishnan, Bangalore (IN)

(73) Assignee: General Electric Company, Schenectady, NY (US)

( * ) Notice: Subject to any disclaimer, the term of this patent is extended or adjusted under 35 U.S.C. 154(b) by 2227 days.

(21) Appl. No.: 10/605,685

(22) Filed: Oct. 17, 2003

(51) Int. Cl.
*A61B 5/05* (2006.01)
(52) U.S. Cl. .......................... 600/410; 324/318; 600/407
(58) Field of Classification Search .................. 600/407, 600/410–423; 324/306–309, 318–322
See application file for complete search history.

(56) References Cited

U.S. PATENT DOCUMENTS

| | | | | |
|---|---|---|---|---|
| 5,275,164 A * | 1/1994 | Maeda et al. | ................. | 600/410 |
| 5,677,854 A * | 10/1997 | Dorri | ................................ | 703/5 |
| 6,108,573 A * | 8/2000 | Debbins et al. | ............... | 600/410 |
| 6,181,338 B1 * | 1/2001 | Brodhun | ....................... | 715/798 |
| 6,529,002 B1 * | 3/2003 | Kim et al. | ..................... | 324/312 |
| 6,747,757 B1 * | 6/2004 | Enomoto | ....................... | 358/1.9 |
| 6,891,371 B1 * | 5/2005 | Frigo et al. | .................... | 324/307 |
| 7,038,680 B2 * | 5/2006 | Pitkow | ........................... | 345/440 |
| 7,218,114 B2 * | 5/2007 | Ni et al. | ......................... | 324/321 |
| 7,235,971 B2 * | 6/2007 | Foxall et al. | .................. | 324/307 |
| 2002/0081009 A1 * | 6/2002 | Licato et al. | .................. | 382/131 |
| 2003/0206648 A1 * | 11/2003 | King et al. | .................... | 382/128 |
| 2006/0164082 A1 * | 7/2006 | Foxall et al. | .................. | 324/306 |

OTHER PUBLICATIONS

Slanetz et al. Occult Contralteral Breast Carcinoma Incidentally Detected by Breast Magnetic Resonance Imaging. Breast Journal. 2002. vol. 8, No. 3, pp. 145-148.*
Kim et al. Automated Bilateral Shimming for Breast MRI. Annual Lucas Reports; 2001, p. 93.*

* cited by examiner

*Primary Examiner* — Brian Casler
*Assistant Examiner* — Nasir S Shahrestani
(74) *Attorney, Agent, or Firm* — Ziolkowski Patent Solutions Group, SC

(57) ABSTRACT

A graphical visualization tool is disclosed that enables a user to graphically define multiple pre-scan volumes on a localizer image. The tool automatically determines appropriate shim values for both pre-scan volumes. Additionally, the tool displays the pre-scanned volumes on the localizer image such that the user knows that the slices/slabs for high resolution imaging are positioned in the region where the user wants the center frequency to lie.

22 Claims, 3 Drawing Sheets

METHOD AND APPARATUS TO GRAPHICALLY DISPLAY A PRE-SCAN VOLUME ON A LOCALIZER IMAGE

BACKGROUND OF INVENTION

The present invention relates generally to MR imaging and, more particularly, to a method and apparatus to graphically display a pre-scan volume on a localizer image.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

During fabrication and construction of the magnet assembly for an MR assembly, manufacturing tolerances and deviations in material make-up results in an inhomogeneous $B_0$ field being created by the magnet assembly absent shimming. As a result of the magnet manufacturing process, it is not uncommon for the magnet to produce an inhomogeneous field ranging from several hundred parts per million (ppm) to several thousand ppm, and a non-accurate center magnetic field that is significantly out of range. The importance of these variations is glaringly apparent given that MR systems require an intense uniform magnetic field, typically less than 10 ppm of variations within a 40-50 cm spherical volume, but also an accurate center magnetic field value, typically less than 0.5% variation.

Typically, a pre-scan is carried to at least identify areas of field inhomogeneity so that shimming and/or other corrective measures may be taken to remove or reduce the inhomogeneities. Shimming is a field homogeneity corrective process that is important for MR systems because the average $B_0$ field strength must be within a certain window for the RF hardware of the system. The shimming process includes the precise placement of shim elements within the magnetic assembly such that numerous small magnetic fields are generated to offset variations in the $B_0$ field. The shim elements include active shims such as shim coils or permanent magnets as well as passive shims such as iron cores. Shim coils are also common in superconducting magnet assemblies and their shimming may be controlled by regulating current thereto. The shimming characteristics of permanent magnets may be controlled by regulating the mass and polarity of the magnet and the shimming effect of iron cores may be controlled by regulating the mass of the iron incorporated into the magnet assembly.

In MR applications, such as bilateral breast imaging, it is important that the center magnetic field and the volume-of-interest be substantially coextensive. For instance, for bilateral breast imaging with improved image quality, the center magnetic field should be positioned relative to both breasts. A number of tools have been developed to assist radiologists and MR technicians with the shimming process. For example, one such tool allows the radiologist to graphically position a 3D slab on a particular anatomy of a localizer image. After identifying and defining scan parameters to acquire MR data of the 3D slab, the radiologist is required to carry out a manual pre-scan to note down shim values and a center frequency high for data acquisition of the identified 3D slab. The radiologist then repositions the 3D slab on another anatomy from which data is to be acquired. Once again, the radiologist defines the scan parameters for data acquisition of the another anatomy. The radiologist then carries out a manual pre-scan to note down shim values and a center frequency high for the another 3D slab. From the shim values and center frequency high acquired for both anatomies, the radiologist must manually determine an average of the values. The radiologist then repositions the 3D slab to cover both of the designated anatomies. Scan parameters are then set for data acquisition of both anatomies in a single data acquisition followed by another manual pre-scan. In this manual pre-scan, the radiologist uses the average shim values and center frequency high previously calculated. Ideally, the average shim values and center frequency high are optimized for data acquisition of the designated anatomies in accordance with the user identified scan parameters. The radiologist then carries out the necessary shimming followed by data acquisition of the designated anatomies.

While the above tool as well as other tools have improved image quality, scan time has increased which negatively affects patient throughput, increases patient discomfort, and increases the propensity for patient induced motion artifacts. Specifically, in the example of bilateral breast imaging, the radiologist must carry out three pre-scan series to achieve good image quality. It would, therefore, be desirable to have a system and method capable of optimizing shimming for data acquisition of multiple anatomies without multiple pre-scan series.

BRIEF DESCRIPTION OF INVENTION

The present invention is directed to a method and apparatus to graphically display a pre-scan volume on a localizer image that overcomes the aforementioned drawbacks. A graphical visualization tool is disclosed that enables a radiologist or other user to graphically define multiple pre-scan volumes on a localizer image. Moreover, the tool automatically determines appropriate shim values for both pre-scan volumes. Additionally, the tool will display the pre-scanned volumes on the localizer image such that the user knows that the slices/slabs for high resolution imaging are positioned in the region where the user wants the center frequency to lie. Accordingly, images are scanned with better quality.

Therefore, in accordance with one aspect of the present invention, a method of MR imaging is disclosed and includes the steps of displaying a localizer image of a volume of interest and displaying, relative to the localizer image, a number of pre-scan volumes. The method further includes the step of setting one or more scan parameters for data acquisition of the number of pre-scan volumes as well as the step of acquiring MR data from the number of pre-scan volumes.

In accordance with another aspect of the present invention, a graphical MR prescription tool includes a display configured to display a localizer image generated from MR data acquired from a subject. The tool further includes a user interface configured to graphically display a slab for data acquisition in the volume-of-interest as well as graphically define a pre-scan volume within the slab.

In accordance with another aspect of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to graphically display a pair of pre-scan volumes on a localizer image.

In accordance with another aspect, the invention is embodied in a computer program stored on a computer readable storage medium and having instructions which, when executed by a computer, cause the computer to display a localizer image and display a slab of interest within the localizer image. The computer is further caused to display a number of pre-scan volumes in the slab. In a further aspect, the computer is programmed to reposition the number of pre-scan volumes in response to one or more user commands.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

A system is shown to carry out a bilateral breast acquisition of MR data. Breast MR imaging is often used to investigate breast concerns first detected with mammography, physical exam, or other imaging exams. MR imaging is also commonly used to image an augmented breast including both the breast implant itself as well as breast tissue surrounding the implant. Imaging the breast tissue surrounding the implant can be important for the identification of certain abnormalities or other signs of breast cancer which may be obscured by the implant on a mammogram. MR imaging is also used for staging breast cancer, determining the most appropriate treatment, and for patient follow-up after breast cancer treatment. One particular MR imaging technique for breast imaging uses a contrast material called gadolinium DTPA which is injected into a vein in the arm of the patient before or during the exam to improve the quality of the images. The contrast agent helps produce stronger and clearer images as well as highlight any abnormalities. In conventional bilateral breast acquisition using contrast enhancement, each breast must be separately imaged thereby requiring the patient to schedule separate MR scan sessions. As will be described in greater detail below, the present invention supports contrast studies on both breasts in the same scan.

While the present invention will be described with respect to bilateral breast acquisition of MR data, one skilled in the art will readily appreciate that the present invention is also applicable for data acquisition of other anatomical regions of a patient and that description of MR data acquisition from the breasts of a patient illustrates one application of the present invention.

Figure 1:
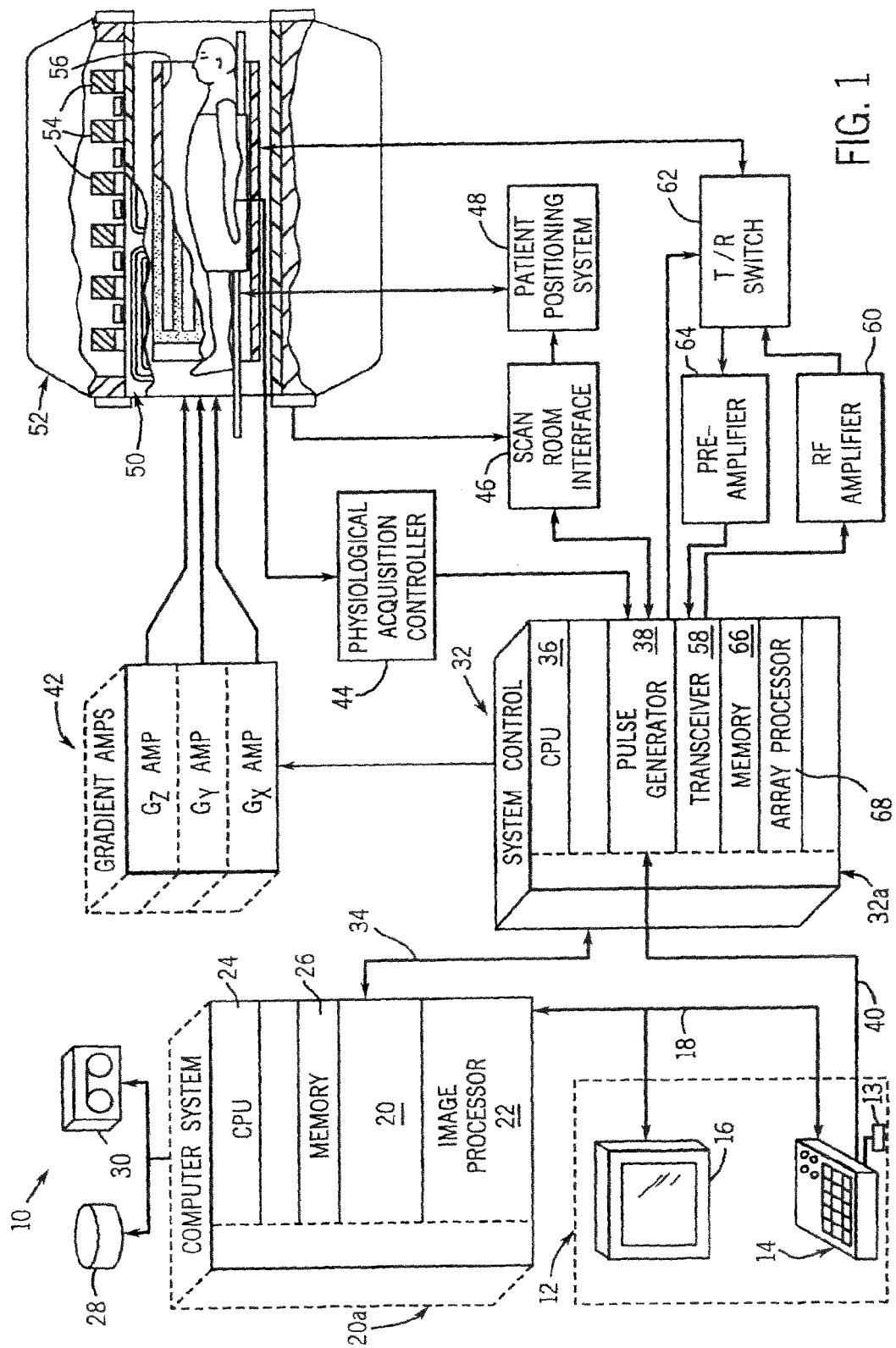
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
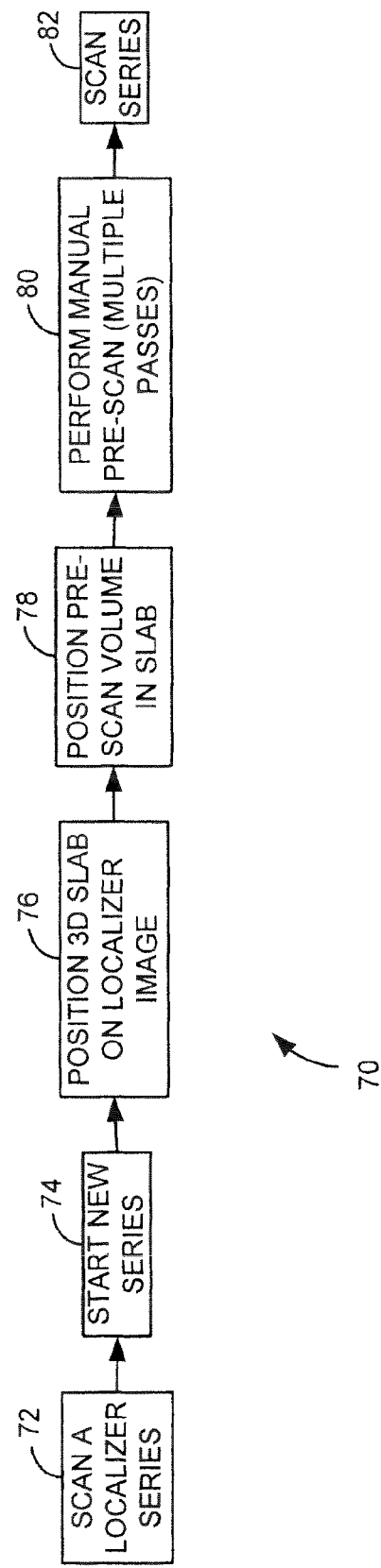
FIG. 2 is a flow chart setting forth the steps of an automated technique of determining shim values.

Referring now to FIG. 2, a control process 70 for automatically determining appropriate shim values for a pair of anatomical regions within an imaging slab are illustrated in flow chart form. The process 70 begins at step 72 with the scanning of a localizer series. The localizer series is carried out to acquire one or more localizer images of the subject to assist the radiologist or other user in isolating particular anatomical regions of the subject from which MR data is to be acquired. Once a particular localizer image is selected, a new scan series is initiated at 74. Initiation of the scan series at 74 includes identification and selection of appropriate scan parameters, pulse sequence, and other user inputs tailoring a particular scan series.

Once the particulars of the scan series are defined at 74, the user then accesses a graphical visualization tool that allows the user to position a slice/slab on the localizer image. In this regard, the slice/slab, which may be two-dimensionally or three-dimensionally defined, corresponds to a particular region or volume-of-interest within the localizer image. In the example of bilateral breast acquisition, the slice/slab would be positioned on the localizer image so as to cover or define data acquisition from both breasts. Once the slab-of-interest is graphically defined on the localizer image 76, the user then positions one or more pre-scan volumes in the slab. Each pre-scan volume corresponds to a shimming region for which shim values are to be determined. In the example of bilateral breast acquisition, a pre-scan volume would be defined within the slab for each breast. It should be noted that the scan parameters may also be defined at step 78 rather than step 74.

The graphical visualization tool allows the user to interactively define and position each pre-scan volume. Further, the display of the pre-scan volumes on a localizer image enables the user to know that the slices/slabs for high resolution imaging are positioned in the region where it is desired for the center frequency to lie. Once the pre-scan volumes are positioned in the slab at 78, a multiple pass pre-scan is carried out. In the first pre-scan pass, the first pre-scan volume is considered such that appropriate shim values are determined for the first pre-scan volume. Another pre-scan pass is then carried out for each additional pre-scan volume identified and positioned within the slab by the user at step 78. The multiple pass pre-scan carried out at step 80 determines the appropriate shim values for each pre-scan volume. In this regard, a pre-scan pass is carried out for each pre-scan volume rather than the slab as a whole. Thereafter, the shim values are conveyed to the user so that the appropriate shimming may be carried out. Alternatively, the shimming values are automatically input to a controller for regulating current to one or more shim coils. Thereafter, the series is scanned at 82 for MR data acquisition of the slab. With this workflow, the user can carry out a bilateral breast scan with just one series and the user is also not required to note down any shim values explicitly and determine, manually, the appropriate shim values for the slab or slice as a whole. Moreover, a single pre-scan series is executed to determine shim values for each of the pre-scan volumes in the slab.

Figure 3:
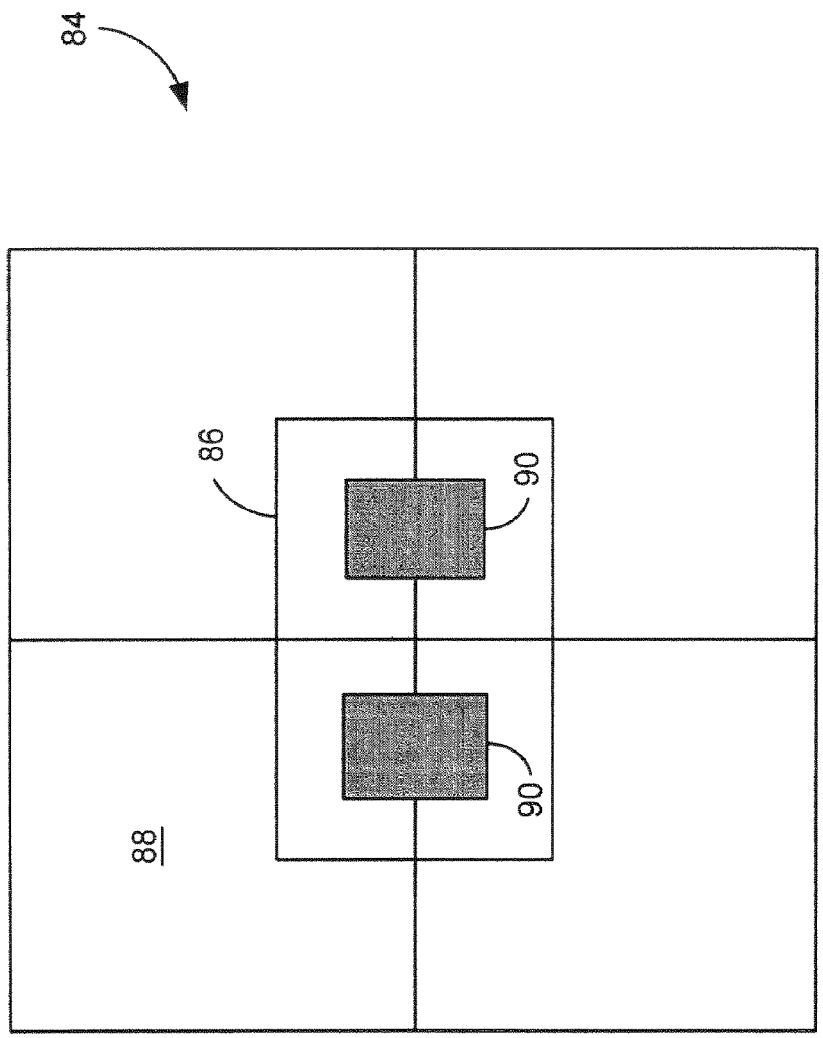
FIG. 3 is a schematic representation of a graphical interface in accordance with the present invention.

Referring now to FIG. 3, a graphical interface that enables a user to position pre-scan volumes within a slab or slice-of-interest is schematically shown. The graphical interface 84 is designed to allow a user to position a slab or slice-of-interest 86 on a localizer image 88 acquired from a subject. The user may then position using, for example, mouse or keypad commands, one or more pre-scan volumes 90 on the localizer image 88 within the user-defined slab or slice 86. In the example of bilateral breast acquisition, the user would preferably identify a pair of pre-scan volumes such that one pre-scan volume is identified for each breast and the slab or slice is sized and positioned to cover both breasts. As such, the user may precisely specify those regions or volumes of the slab for which shimming is to be done. It should be noted that the graphical interface 84 may be implemented to define a slice/slab as well as pre-scan volumes for a coronal image, saggital image, or axial image. Moreover, the present invention may also be utilized for oblique imaging. In this regard, multiple interfaces may be displayed in a single display to allow the user to three-dimensionally define and position pre-scan volumes for coronal, saggital, and axial imaging in a single graphical user interface or window.

Therefore, in accordance with one embodiment of the present invention, a method of MR imaging is disclosed and includes the steps of displaying a localizer image of a volume of interest and displaying, relative to the localizer image, a number of pre-scan volumes. The method further includes the step of setting one or more scan parameters for data acquisition of the number of pre-scan volumes as well as the step of acquiring MR data from the number of pre-scan volumes.

In accordance with another embodiment of the present invention, a graphical MR prescription tool includes a display configured to display a localizer image generated from MR data acquired from a subject. The tool further includes a user interface configured to graphically display a slab for data acquisition in the volume-of-interest as well as graphically define a pre-scan volume within the slab.

In accordance with another embodiment of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to graphically display a pair of pre-scan volumes on a localizer image.

In accordance with another embodiment, the invention is embodied in a computer program stored on a computer readable storage medium and having instructions which, when executed by a computer, cause the computer to display a localizer image and display a slab of interest within the localizer image. The computer is further caused to display a number of pre-scan volumes in the slab. In a further embodiment, the instructions cause the computer is programmed to reposition the number of pre-scan volumes in response to one or more user commands.

The present invention has been described in terms of the preferred embodiment, and it is recognized that equivalents, alternatives, and modifications, aside from those expressly stated, are possible and within the scope of the appending claims.

What is claimed is:

1. A method of MR imaging for a bilateral breast scan comprising the steps of:
   acquiring a localizer image of a volume-of-interest from a scanning of a localizer series;
   displaying the localizer image;
   displaying a number of pre-scan volumes overlaid on the localizer image, each pre-scan volume corresponding to a shimming region for which shim values are to be determined;
   positioning the pre-scan volumes at desired locations on the localizer image in response to user input;
   performing a multiple pass pre-scan session to set one or more scan parameters for data acquisition of the number of pre-scan volumes, the one or more scan parameters including a shim value for each of the number of pre-scan volumes;
   acquiring MR data from the number of pre-scan volumes; and
   reconstructing an image from the MR data
   wherein the desired locations correspond to a first breast and a second breast such that one pre-scan volume includes the first breast and another pre-scan volume includes the second breast, and wherein the step of acquiring MR data includes the step of executing a bilateral breast series of data acquisition.

2. The method of claim 1 wherein the one or more parameters further includes a value of center field homogeneity.

3. The method of claim 1 wherein the step of displaying the number of pre-scan volumes includes the step of enabling a user to position a pre-scan volume relative to the volume-of-interest.

4. The method of claim 3 further comprising the step of allowing the user to define a center frequency slice/slab in the volume-of-interest.

5. The method of claim 1 wherein the multiple pass pre-scan session includes a first pass pre-scan of a first pre-scan volume and a second pass pre-scan of a second pre-scan volume.

6. A graphical MR prescription tool comprising:
   a display configured to display a localizer image generated from MR data acquired from a subject; and
   a computer configured to:
   graphically display the localizer image on the display;
   graphically display a slab for data acquisition on the localizer image;
   enable a user to interactively define and position a pair of pre-scan volumes within the slab, the pair of pre-scan volumes corresponding to a first breast and a second breast of a patient;
   graphically define the pre-scan volume within the slab;
   determine a shim value for the pre-scan volume corresponding to the first breast in a first pre-scan pass; and
   determine a shim value for the pre-scan volume corresponding to the second breast in a second pre-scan pass;
   wherein the shim values are automatically determined by the computer without a manual setting of such shim values by the user and are applied to control shimming during a subsequent bilateral breast series MR data acquisition from the slab.

7. The graphical tool of claim 6 wherein the pre-scan volume includes a shimming region.

8. The graphical tool of claim 6 wherein the user interface is further configured to allow a user to define slices/slabs for high resolution imaging such that the slices/slabs are in a region where the user wants a center frequency to lie.

9. The graphical tool of claim 8 wherein the slab includes multiple pre-scan volumes.

10. The graphical tool of claim 6 wherein the user interface is further configured to graphically define another pre-scan volume within the slab.

11. The graphical tool of claim 10 wherein the pre-scan volume includes a first breast region of the subject and the another pre-scan volume includes a second breast region of the subject.

12. An MRI apparatus comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
    cause the MRI system to scan a localizer series to acquire a localizer image of a desired anatomical region of a patient;
    display the localizer image;
    graphically display a pair of pre-scan volumes on the localizer image;
    enable an operator directed positioning of the pre-scan volumes over desired anatomical regions on the localizer image;
    determine shim values for the pair of pre-scan volumes by performing a pair of pre-scans, with the shim values being implemented to control shimming during a subsequent MR data acquisition from the slab;
    wherein the determining of the shim values by the computer eliminates the need for a manual setting of such shim values by the operator.

13. The MRI apparatus of claim 12 wherein the computer is further programmed to determine shim values for a first pre-scan volume in a first pre-scan pass and shim values for a second pre-scan volume in a second pre-scan pass.

14. The MRI apparatus of claim 12 wherein the computer is further programmed to display the pair of pre-scan volumes three-dimensionally.

15. The MRI apparatus of claim 12 wherein the computer is further programmed to graphically re-position at least one of the pre-scan volumes in response to one or more user commands.

16. The MRI apparatus of claim 12 wherein the pair of pre-scan volumes corresponds to the breasts of a patient.

17. A non-transitory computer readable storage medium having a computer program stored thereon and representing a set of instructions that when executed by a computer causes the computer to:
    scan a localizer series to acquire a localizer image of a breast region of a patient;
    display the localizer image;
    display a slab of interest on the localizer image that defines a region or volume-of-interest within the localizer image, the volume-of-interest encompassing the breast region;
    display a number of pre-scan volumes in the slab;
    provide for placement of the number of pre-scan volumes in the slab and on the localizer image in response to operator instructions, such that the pre-scan volumes are positionable over a first breast and a second breast in the breast region;

perform pre-scan passes to determine shim values for the number of pre-scan volumes, without any manual setting of such shim values by an operator;

execute a bi-lateral breast scan imaging sequence to acquire MR data of the number of pre-scan volumes, wherein the shim values for the number of pre-scan volumes are implemented in executing the imaging sequence; and reconstruct an image of the first and second breasts from the MR data.

18. The non-transitory computer readable storage medium of claim 17 wherein the set of instructions further causes the computer to re-position the number of pre-scan volumes in response to one or more user commands.

19. The non-transitory computer readable storage medium of claim 17 wherein the set of instructions further causes the computer to execute a first pre-scan of a first pre-scan volume and a second pre-scan of a second pre-scan volume.

20. The non-transitory computer readable storage medium of claim 17 wherein the number of pre-scan volumes in the slab includes a first breast region of the subject and a second breast region of the subject.

21. The non-transitory computer readable storage medium of claim 20 wherein the computer is further programmed to determine shim values for the first breast region of the pre-scan volumes in a first pre-scan pass and shim values for a second breast region of the pre-scan volumes in a second pre-scan pass.

22. The method of claim 1 further comprising automatically inputting the shimming values to a controller for regulating current to one or more shim coils during acquisition of the MR data.

* * * * *